Figure 1:
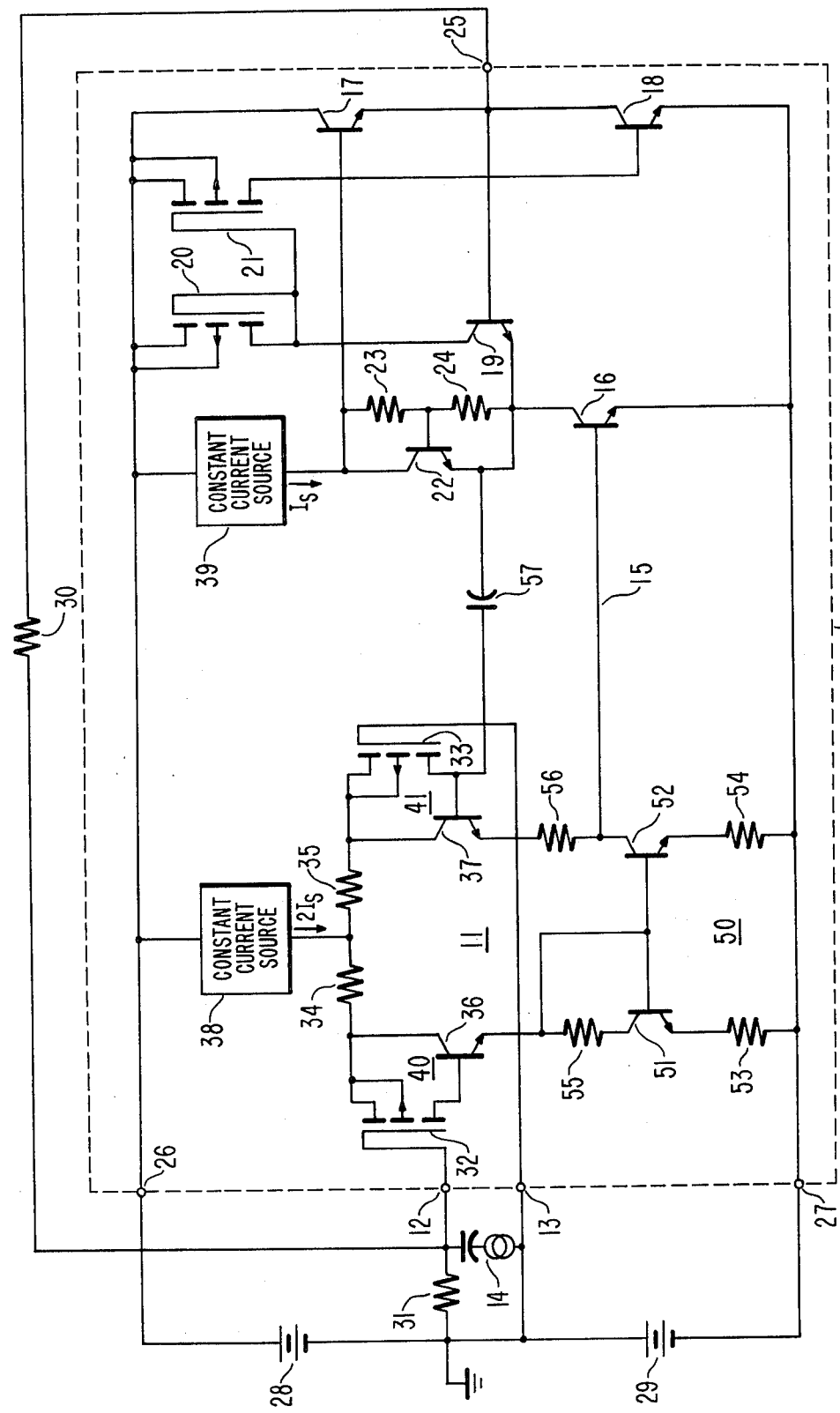

United States Patent [19]

Crowle

[11] 4,078,206

[45] Mar. 7, 1978

[54] DIFFERENTIAL AMPLIFIER

[75] Inventor: Brian Crowle, Ashford, England

[73] Assignee: RCA Corporation, New York, N.Y.

[21] Appl. No.: 767,958

[22] Filed: Feb. 11, 1977

Related U.S. Application Data

[63] Continuation of Ser. No. 664,811, Dec. 29, 1975, abandoned.

[30] Foreign Application Priority Data

Feb. 24, 1975 United Kingdom ............... 7660/75

[51] Int. Cl.$^2$ .......................... H03F 3/16; H03F 3/45
[52] U.S. Cl. .................................. 330/253; 330/257; 330/260; 330/300; 330/307
[58] Field of Search ................... 330/17, 22, 30 D, 35, 330/38 M; 357/43

[56] References Cited

U.S. PATENT DOCUMENTS 3,760,288  9/1973  Leonard ........................... 330/30 D
3,914,683  12/1975  Van de Plassche ........... 330/30 D X

FOREIGN PATENT DOCUMENTS 1,216,061  12/1970  United Kingdom.

OTHER PUBLICATIONS

Waddington – "Sensitive FET Voltmeter"—Wireless World, pp. 99–101, May, 1968.

Primary Examiner—Lawrence J. Dahl
Attorney, Agent, or Firm—H. Christoffersen; A. Limberg

[57] ABSTRACT

Source-coupled first and second FET's arranged to receive input signal potential between their gate electrodes have their respective drain electrodes coupled to the base electrodes of first and second bipolar transistors. The collector electrode of the first and second bipolar transistors are connected to the source electrodes of the first and second FET's, respectively. The emitter electrodes of the first and second bipolar transistors supply balanced output signal currents.

11 Claims, 2 Drawing Figures

DIFFERENTIAL AMPLIFIER

This is a continuation of application Ser. No. 664,811, filed Dec. 29, 1975, now abandoned.

The present invention relates to a differential amplifier employing a pair of source-coupled field-effect transistors (FET's) with input signal applied between their gate electrodes and with balanced output signals available from their drain electrodes.

Such amplifiers are generally analogous to differential amplifiers employing emitter-coupled bipolar transistors. One will, in view of the recently developed bipolar-FET intergrated circuit technologies, seek to use field-effect transistors rather than lateral-structure bipolar transistors in integrated circuit designs because of the better high-frequency response. Also, FET's can handle greater input signal potential swings than bipolar transistors. However, simply replacing the bipolar transistors in emitter-coupled differential amplifiers with FET's causes problems in linear-amplifier design. For example, when used as the first stage of a plural-stage amplifier having an overall feedback loop including all its stages and exhibiting substantial open-loop gain, there is a marked increase in the distortion introduced into the amplifier.

The present inventor has discovered the more important reasons for increase in the open-loop distortion of such an amplifier. One is that the source-follower action of an FET is less linear than the emitter-follower action of a bipolar transistor. The inventor has discerned that this inferior potential-follower action arises because the relatively low transconductance of an FET causes the gate-to-source potential to change too much as a function of source current level.

The inventor has found that the low transconductance of the FET makes its common-gate-amplifier input impedance vary more as a function of input signal change than the common-base amplifier input impedance. This is because the input impedances of such amplifiers are reciprocally related to device transconductance. In operation in which there is single-ended input signal drive to the differential amplifier using source-coupled FET's, the poor source-follower action of the input FET and the common-gate input impedance variation of the FET source-coupled therewith provide distortions which combine differentially. Since FET's have square-law rather than linear transconductance variation with source content, these distortions have been found not to cancel each other appreciably. Where the differential amplifier receives different signals at its two input terminals, the non-linearity problems just discussed have been found to cause unwanted cross-modulation.

Another reason discerned by the inventor for increased distortion in the FET amplifier is that the drain current versus source-to-drain potential characteristic curves exhibit more slope than do the collector current versus emitter-to-collector potential characteristic curves of a bipolar transistor. Therefore, the transconductance of the FET varies more as a function of its source-to-drain potential, than the transconductance of the bipolar transistor varies as a function of its collector-to-emitter potential.

The foregoing effects upon the open-loop amplifier distortion should be kept in mind even though the causes of closed-loop distortion in a feedback system do not always correspond to this or that open-loop distortion condition.

The relatively low transconductance of the FET also has been determined by the inventor to cause the following problem when it replaces a bipolar transistor in a plural stage amplifier with overall feedback. The error signal formed by subtracting the feedback signal from the input signal will operate the FET over a relatively large portion of its transconductance characteristic, so its square-law nature shows up excessively in the overall transfer characteristic of the amplifier. Increasing amounts of feedback operate to make this condition worse, and the effectiveness of increased feedback is soon exhausted.

Now, while it has been known per se that the transconductance of the FET is lower than that of the bipolar transistor, it has been widely believed that this is only a problem of shortage of gain and that with the addition of a further cascaded amplifier stage, overall performance equal to that available with differential amplifier input stages using emitter-coupled bipolar transistors could be achieved. The present inventor has discovered this assumption not to be well-founded. The additional gain required to supplement the gain of the source-coupled FET differential-amplifier should be introduced at a point in the circuit such that it will linearize those portions of the circuit where the principal non-linearities in amplification arise. Then, when the source-coupled FET differential amplifier and the auxiliary amplifier are incorporated into an overall feedback loop, the effect of the overall feedback will not be dissipated in attempting to remedy a particularly bad non-linearity in one portion of the circuit, but rather will be available to force down non-linearity throughout the whole of the circuit.

The present inventor proposes to solve the problem of non-linearity in amplifiers using source-coupled FET's in a differential-amplifier input stage by increasing the apparent transconductances of the FET's. The inventor believes himself to be the first to recognize this type of solution to be necessary and desirable. He advocates the use of bipolar transistor current gain to multiply the transconductance of the source-coupled differential-amplifier FET's in implementing this solution. Such transconductance multiplication has been employed in the prior art for achieving other ends.

Figure 2:
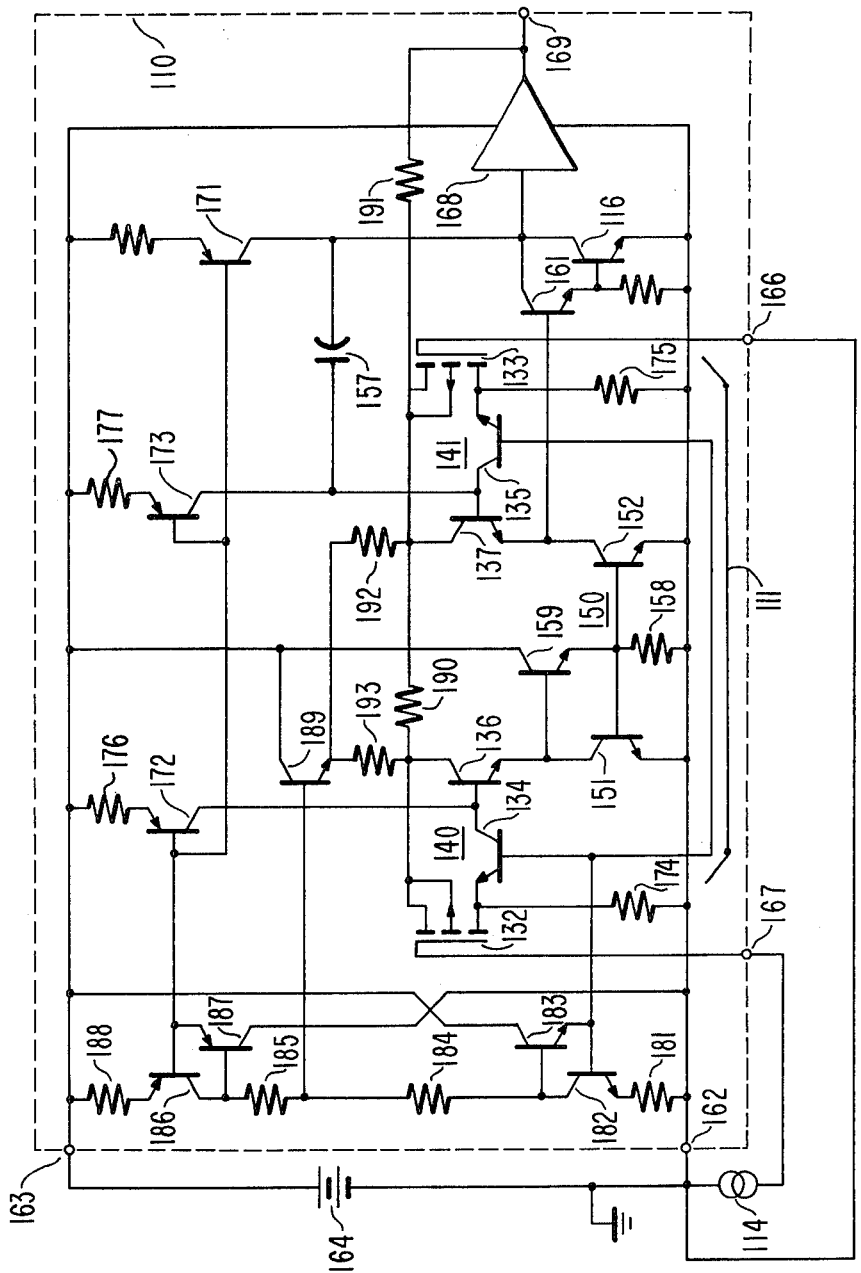

In the drawing:

FIG. 1 is a schematic diagram showing a differential-amplifier embodying the present invention; and FIG. 2 is a schematic diagram showing a differential-amplifier embodying the present invention and having its input terminals biased to the least positive supply potential.

Referring to FIG. 1, integrated operational amplifier 10 shown within dotted outline includes, at left, a differential-input amplifier 11 embodying the present invention and having input terminals 12 and 13. A source 14 of input signal is shown with one of its terminals directly connected to terminal 13 and with the other of its terminals capacitively coupled to terminal 12. Amplifier 11 provides an amplified response to this input signal, which is applied through interconnection 15 to the base electrode of a transistor 16 connected in common-emitter amplifier configuration. The collector current variations of transistor 16 have their positive excursions directed to the base electrode of transistor 17 and their negative excursions directed to the base electrode of transistor 18 by operation of elements 19, 20, 21, 22, 23, 24. Transistors 17 and 18 operate in Class AB push-pull with each other to provide a much amplified output signal at output terminal 25.

The Class AB amplifier is of the sort described by M. B. Knight in U.S. Pat. No. 3,863,169 issued Jan. 22, 1975.

Output terminal 25 is maintained at an operating point substantially midway between the positive and negative operating potentials applied to terminals 26 and 27, respectively, of operational amplifier 10 from batteries 28 and 29, respectively. This is done by means of a direct-coupled overall negative feedback connection from output terminal 25 to inverting input terminal 12 via a resistive potential divider comprising resistors 30 and 31.

In differential-input amplifier 11, p-channel FET's 32 and 33 have their gate electrodes connected to input terminals 12 and 13, respectively, and have their source electrodes coupled to each other through the combined resistances of resistors 34 and 35. The effective transconductances of transistors 32 and 33 are multiplied by the current gains of transistors 36 and 37, respectively. This is done in each instance by applying the FET (32 or 33) drain current as base current to a complementary-conductivity type bipolar transistor (36 or 37) which has its collector electrode connected back to the FET source electrode. FET 32 and bipolar transistor 36 together form a compound FET 40 with a transconductance equal to the transconductance of FET 32 multiplied by the common-emitter forward current gain of transistor 36. Compound FET 40 has its effective gate electrode at that of FET 32, has its effective source electrode at the interconnection between the source electrode of FET 32 and the collector electrode of transistor 36, and has its effective drain electrode at the emitter of transistor 36. FET 33 and bipolar transistor 37 together form a similar compound FET 41.

The effective drain electrodes of compound FET's 40 and 41 supply currents with push-pull, balanced variations to a current mirror amplifier 50 comprising elements 51–56, which converts these variations to single-ended form for application to the base electrode of transistor 16. Constant current source 38 supplies a direct current $2I_S$, twice as large as the direct current $I_S$ supplied by the constant current source acting as active collector load for transistor 16. The $2I_S$ current from source 38 is split between the two halves of the amplifier 11, half being supplied as quiescent source current to compound FET 40 and the other half as quiescent source current to compound FET 41. Except for the use of linearizing resistors 34 and 35 and compound FET's 40 and 41 rather than simple FET's, the combination comprising:

(a) the differential-input amplifier, (b) the current mirror amplifier used for balanced to single-ended signal conversion, and (c) ensuing common-emitter amplifier functions substantially as taught in U.S. Pat. No. 3,825,679.

Capacitor 57 provides collector-to-base feedback to transistor 16 to establish the dominant low-frequency time constant in the open-loop response of amplifier 10. Connecting the capacitor 57 as shown secures the emitter-follower action of transistor 37 to buffer against the low base-input impedance of transistor 16. Therefore, capacitor 57 can be of lower capacitance and, consequently, of reduced physical size.

In a three-terminal amplifier, the impedance looking into its common terminal is equal to the reciprocal of the transadmittance of the amplifier device. For lower frequencies where reactive effects can be ignored, the transadmittance is essentially the transconductance of the amplifier device. Since the transconductance of compound FET's 40 and 41 is higher than that encountered in a simple FET, their effective source impedances are very low. Consequently, the effects of non-linearities in these effective source impedances can be substantially diminished with relatively low-resistance resistors 34 and 35 as compared to the case where only simple FET's are used. This reduced need for source degeneration results in increased gain in amplifier 11 and decreases the input signal range required to exert effective direct-coupled overall feedback around operational amplifier 10. The smaller input signal requirements of the higher gain amplifier 11 permit its FET's to be operated with smaller gain potential variations and over a smaller portion of their transconductance characteristic, reducing the distortion caused by their transconductance varying as a function of source-to-drain potential. The direct potential drops across resistors 34 and 35 responsive to quiescent current flows is reduced, in accordance with Ohm's Law, which permits amplifier 11 to handle large common-mode signal potentials or alternatively to be operated with lower supply potential.

The present invention can, surprisingly enough, reduce the area required for a high gain differential-input preamplifier in a monolithic operational amplifier. This comes about because the transconductance of a FET is proportional to its channel width; so high transconductance FET's take up large areas on the integrated-circuit die. Current gain of vertical-structure bipolar transistors, on the other hand, is not a function of transistor area, so small bipolar transistors can raise the transconductance of FET's they are associated with without taking up much die area.

In FIG. 2, operational amplifier 110 within dotted line comprises compound FET's 140, 141 and current mirror amplifier 150 and may be constructed in monolithic integrated-circuit form. Generally, its operation is as follows:

Terminals 162 and 163 are arranged for application of an operating potential therebetween, shown as being supplied by battery 164. Input terminals 166 and 167 are connected, respectively, to ground potential and to a source 114 of input signal potential referred to ground potential. The response of differential-input amplifier 111 to this input signal potential is applied to the Darlington cascade comprising transistors 161 and 116 for further amplification. The further amplified signal is applied to the input terminal of output amplifier 168 to cause an output signal potential at terminal 169 of operational amplifier 110. Transistors 161 and 116 are provided an active collector load from the collector electrode of transistor 171, transistor 171 being biased for constant current operation. Capacitor 157 is used to establish the dominant low-frequency time constant in the open-loop response of operational amplifier 110.

Operational amplifier 110 is designed to be used to receive input signal potential from a source 114 biased to the least positive supply potential available (here, ground). To this end, its differential-input preamplifier 111 employs matched compound FET's 140 and 141 which are each of a form believed to be patentably novel. They differ from compound FET's 40 and 41 in the FIG. 1 configuration in the following way. In each of the compound FET's 140 and 141, the drain current variations of the component FET (132 or 133) is not coupled directly to the base electrode of the bipolar transistor (136 or 137) having its collector connected to the source electrode of the component FET. Rather, this coupling is by means of a common-base amplifier transistor (134 or 135) of complementary conductivity type to the component FET.

Now, amplifier 11 of the FIG. 1 configuration could be operated with its input terminals biased at the least positive supply potential available. But, since enhancement FET's which can be integrated together with bipolar transistors have a threshold value of gate-to-source voltage of only about 1.5 or 2 volts at which conduction obtains, the FET's operate with severely restricted drain-to-source potential. Small changes in drain-to-source voltages of FET's 32 and 33, as occur during operation of amplifier 11, will then undesirably cause appreciable changes in the FET transconductances. This problem becomes a particularly acute problem when the simple current mirror amplifier 50 is replaced by a balanced to single-ended signal converter which must be biased with slightly higher potentials at its input and output circuits.

In FIG. 2, balanced to single-ended conversion is done with a well-known type of current mirror amlifier 150, which amplifier comprises elements 151, 152, 158, 157 and requires a potential of about 1.3–1.5 volts across its input circuit. Also, common-emitter amplifier transistor is connected in Darlington-cascade after transistor 161, and this Darlington cascade requires a potential of about 1.3–1.5 volts between the base electrode of transistor 161 and the emitter electrode of transistor 116. Consequently, the quiescent potentials of transistors 136 and 137 must be about 2.0 to 2.2 volts. If the drain electrodes of FET's 132 and 134 were required to be biased to this potential, it would not permit such a satisfactory operation with grounded-gate FET's 132 and 133 having only a 1.5 to 2.0 volt threshold potential.

Common-base amplifier transistors 134 and 135, with their base electrodes biased to place their emitter-electrodes at quiescent potentials only a few tenths of a volt more positive with respect to ground, couple the drain electrodes of FET's 132 and 133, respectively, to the base electrodes of bipolar transistors 136 and 137, respectively, in such a way as to solve this voltage translation problem.

Elements 181–189 are an internal bias network. This network supplies a direct bias potential a few tenths of a volt larger than the base-emitter offset potentials of transistors 134 and 135 between terminal 162 and their base electrodes, facilitating the operation of these transistors as common base amplifiers. A similar or somewhat larger direct bias potential is applied by the internal bias network between terminal 163 and the base electrodes of transistors 171, 172 and 173 to bias them for constant-collector-current operation. Resistors 184 and 185 have substantially equal resistances, appreciably larger than those of emitter degeneration resistors 181 and 188, so a potential midway between those appearing at terminals 162 and 163 is developed at the emitter electrode of transistor 189.

Optimum biasing of the compound FET's 140 and 141 for Class A amplification is done in the following way. A suitable value is chosen for the quiescent drain currents of FET's 132 and 133, the choice being governed by the size of the FET's and the source-to-gate potential at which it is convenient to operate. For example, a source-to-gate voltage of about −3 volts is convenient in a circuit with FET's having threshold voltages of the order of −1.75 volts, a source-to-drain current level of 100 microamperes being easily achieved with FET's 132 and 133 being of readily integrable size. This source-to-drain current level should exceed the peak signal current level to be expected, which can be determined as outlined later in the specification.

Composite FET 140 includes a degenerative feedback loop for quiescent currents in which the difference between the collector currents of transistors 172 and 134 is degenerated by the cascade operation of transistor 136 as a common-emitter amplifier, FET 132 as a common-gate amplifier, and transistor 134 as a common-base amplifier. The gain of this loop is such that the base current of transistor 136 is negligibly small compared to the collector currents of transistors 172 and 134. So the quiescent collector current and consequently the quiescent emitter current of transistor 134 is adjusted by the degenerative feedback, substantially to equal the constant current provided from the collector electrode of transistor 172. Compound FET 141 includes a similar degenerative feedback loop for quiescent currents that adjusts the quiescent emitter current for transistor 135 substantially to equal the constant current provided from the collector electrode of transistor 173.

The grounded-base amplifier transistors 134 and 135 preferably are provided with quiescent emitter currents of comparable size with the peak variation drain currents of the FET's 131 and 132, respectively. Causing transistors 134 and 135 to have quiescent emitter currents smaller than the quiescent drain currents of the FET's 132 and 133 might result in transistors 134 and 135 undesirably being driven out of conduction during large input signal swings. On the other hand, higher quiescent emitter currents for transistors 134 and 135 undesirably make the circuit more sensitive to mismatch of the current source transistors 172 and 173.

The quiescent drain current of FET 132 and quiescent emitter current of transistor 134 flow together through resistor 174; the quiescent drain current of FET 133 and quiescent emitter current of transistor 135 flow together through resistor 175. The direct potential applied to the base electrodes of transistors 134 and 135 being known, their emitter potentials are known to be smaller by their respective base-emitter junction offset potentials. Appropriate resistances of resistors 174 and 175 can be calculated according to Ohm's Law knowing the required potential drop across and quiescent current flow through each resistor.

To avoid undesired output offsets being developed, the two halves of the differential amplifier should be closely matched in their operation. This means that the following components must be matched in pairs: 176 and 177; 172 and 173; 134 and 135; 174 and 175; 132 and 133. Resistor 190 couples the effective source electrodes of compound FET's 140 and 141 to each other and linearizes the amplification afforded by those compound transistors. Resistors 191 and 192 form a resistive potential divider for the signal potential appearing at output terminal 169, and the divided signal potential is applied to the effective source electrode of compound FET 141 to provide a direct-coupled degenerative feedback connection. The potential division is necessary so excursions of the output potential close to ground potential will not deprive compound FET 141 of necessary drain-to-source potential. Resistors 191 and 192 tend to introduce a direct current imbalance in the halves of differential input amplifier 111 containing compound FET's 140 and 141, respectively. This imbalance is avoided by a resistor 193, which has a resistance equal to the parallelled resistances of resistors 191 and 192, being connected between the effective source electrode of compound FET 140 and the emitter electrode of transistor 189 (which, as previously remarked, is at a potential midway between those applied to terminals 162 and 163). The resultant arrangement permits the quiescent output potential at terminal 169 to also be at this midway value when the gate electrodes of FET's 132 and 133 are at the same potential.

Knowing that in the no-input signal condition, no current flows through resistor 190, the order of magnitude of signal-current as compared to direct-current component in the drian currents of FET's 132 and 133 can be determined as follows. The combined collector currents of transistors 136 and 137 is determined by the currents supplied via resistors 191, 192 and 193. Of these, only the current supplied via resistor 191 is subject to wide variation, which variation appears as the output terminal 169 swings over the gamut of operating potential provided by battery 164. Since the input stage 111 is biased so compound FET's 140 and 141 operate push-pull, half the current variation introduced via resistor 191 must be handled by each of these compound FET's, flowing basically as variations in the collector currents of transistors 136 and 137. These variations will not exceed one-half the supply voltage (maximum output signal voltage swing), divided by the resistance of resistor 191. To support these collector current variations, the base current variations of transistors 136 and 137 need only be $1/h_{fe}$ times as large, where $h_{fe}$ is the common-emitter forward current gain of transistors 136 and 137. Similar drain current variations need be supplied by FET's 132 and 133 to support these base current variations, since the current gains of common-base amplifier transistors 134 and 135 are each substantially equal to $-1$. Where the supply voltage afforded by battery 164 is 20 volts, the resistance of resistor 191 is 10 kilohms, and $h_{fe}$ is 100 the signal component of the drain current of FET 132 or 133 would be about 10 microamperes, well below its 100 microampere direct component in the example set forth above.

What is claimed is:

1. An amplifier disposed on a monolithic die comprising:
   first and second terminals for application of an energizing potential therebetween;
   third and fourth terminals for application therebetween of an input signal potential referred to said energizing potential;
   a fifth terminal;
   first and second field effect transistors of a first conductivity type, having respective gate electrodes respectively connected to said third terminal and to said fourth terminal, having respective source and drain electrodes with respective channels therebetween, their source electrodes coupled to each other and direct current conductively coupled to said first terminal;
   first and second bipolar transistors of a second conductivity type, each having base and emitter and collector electrodes, said first and said second conductivity types being complementary to each other, the collector electrodes of said first and said second bipolar transistors being respectively connected to the source electrode of said first field effect transistor and to the source electrode of said second field effect transistor;
   first coupling means connected between the drain electrode of said first field effect transistor and the base electrode of said first bipolar transistor for causing at least a portion of the drain current of said first field effect transistor to flow as at least a portion of the base current of said first bipolar transistor;
   second coupling means connected between the drain electrode of said second field effect transistor and the base electrode of said second bipolar transistor for causing at least a portion of the drain current of said second field effect transistor to flow as at least a portion of the base current of said second bipolar transistor;
   balanced-to-single-ended signal converter means for converting the balanced emitter currents of said first and second bipolar transistors to single-ended form for application to said fifth terminal;
   current mirror amplifier means being included in said signal converter means having an input terminal connected to the emitter electrode of said first bipolar transistor, having a common terminal connected to said second terminal, and having an output terminal connected to said fifth terminal; and
   a connection of the emitter electrode of said second bipolar transistor to said fifth terminal, included within said signal converter means, said first bipolar transistor co-acting with said first field effect transistor to provide a composite device with higher transconductance for given area on the monolithic die than would be possible by widening the channel of said first field effect transistor, and said second bipolar transistor co-acting with said second field effect transistor to provide a composite device with higher transconductance for given area on the monolithic die than would be possible with widening the channel of said second field effect transistor.

2. An amplifier as set forth in claim 1 wherein the source electrodes of said first and said second field effect transistors are coupled to each other as said, via resistive means.

3. An amplifier comprising:
   first and second terminals for application of an energizing potential therebetween;
   third and fourth terminals for application therebetween of an input signal potential referred to said energizing potential;
   a fifth terminal;
   first and second field effect transistors of a first conductivity type having respective gate electrodes respectively connected to said third terminal and to said fourth terminal, having respective source electrodes coupled to each other and direct current conductively coupled to said first terminal, and having respective drain electrodes;
   first and second bipolar transistors of a second conductivity type, each having base and emitter and collector electrodes, said first and said second conductivity types being complementary to each other, the collector electrodes of said first and said second bipolar transistors being respectively connected to the source electrode of said first field effect transistor and to the source electrode of said second field effect transistor;

first coupling means connected between the drain electrode of said first field effect transistor and the base electrode of said first bipolar transistor for causing at least a portion of the drain current of said first field effect transistor to flow as at least a portion of the base current of said first bipolar transistor;

second coupling means connected between the drain electrode of said second field effect transistor and the base electrode of said second bipolar transistor for causing at least a portion of the drain current of said second field effect transistor to flow as at least a portion of the base current of said second bipolar transistor;

balanced-to-single-ended signal converter means for converting the balanced emitter currents of said first and second bipolar transistors to single-ended form for application to said fifth terminal;

current mirror amplifier means being included in said signal converter means having an input terminal connected to the emitter electrode of said first bipolar transistor, having a common terminal connected to said second terminal, and having an output terminal connected to said fifth terminal; and a connection of the emitter electrode of said second bipolar transistor to said fifth terminal, included within said signal converter means, wherein at least one of said first and said second coupling means includes its own further bipolar transistor of said second conductivity type connected in common-base amplifier configuration.

4. An amplifier as set forth in claim 1 wherein at least one of said first and said second coupling means comprises a direct connection.

5. An amplifier comprising:
first and second terminals for application of an energizing potential therebetween;
third and fourth terminals for application therebetween of an input signal potential referred to said energizing potential;
a fifth terminal;
first and second field effect transistors of a first conductivity type, having respective gate electrodes respectively connected to said third terminal and to said fourth terminal, having respective source electrodes coupled to each other and direct current conductively coupled to said first terminal, and having respective drain electrodes;
first and second bipolar transistors of a second conductivity type, each having base and emitter and collector electrodes, said first and said second conductivity types being complementary to each other, the collector electrodes of said first and said second bipolar transistors being respectively connected to the source electrode of said first field effect transistor and to the source electrode of said second field effect transistor;
first coupling means connected between the drain electrode of said first field effect transistor and the base electrode of said first bipolar transistor for causing at least a portion of the drain current of said first field effect transistor to flow as at least a portion of the base current of said first bipolar transistor;
second coupling means connected between the drain electrode of said second field effect transistor and the base electrode of said second bipolar transistor for causing at least a portion of the drain current of said second field effect transistor to flow as at least a portion of the base current of said second bipolar transistor;

balanced-to-single-ended signal converter means for converting the balanced emitter currents of said first and second bipolar transistors to single-ended form for application to said fifth terminal;

current mirror amplifier means being included in said signal converter means having an input terminal connected to the emitter electrode of said first bipolar transistor, having a common terminal connected to said second terminal, and having an output terminal connected to said fifth terminal;

a connection of the emitter electrode of said second bipolar transistor to said fifth terminal, included within said signal converter means;

a third bipolar transistor of said second conductivity type having a base electrode to which said second bipolar transistor emitter electrode is direct coupled, having an emitter electrode direct current conductively connected to said second terminal and having a collector electrode;

collector load means connecting said third bipolar transistor collector electrode to said first terminal; and a capacitor connected between said third bipolar transistor collector electrode and said second bipolar transistor base electrode.

6. An amplifier as set forth in claim 5 having:
further amplifier means responding to variations in the collector current of said third bipolar transistor for providing an output signal; and
means applying at least a portion of said output signal to at least one of said third and said fourth terminals for completing a degenerative feedback loop.

7. An amplifier comprising:
first and second terminals for application of an energizing potential therebetween;
third and fourth terminals for application therebetween of an input signal potential referred to said energizing potential;
first and second field effect transistors of a first conductivity type, having respective gate electrodes respectively connected to said third terminal and to said fourth terminal, having respective source electrodes coupled to each other and direct current conductively coupled to said first terminal, and having respective drain electrodes;
first, second, third and fourth bipolar transistors of a second conductivity type, each having base and emitter and collector electrodes, said first and said second conductivity types being complementary to each other, the collector electrodes of said first and said second bipolar transistors being respectively connected to the source electrode of said first field effect transistor and to the source electrode of said second field effect transistor;
means connecting said third bipolar transistor in a first common base amplifier configuration for coupling the drain electrode of said first field effect transistor to the base electrode of said first bipolar transistor;
means connecting said fourth bipolar transistor in a second common base amplifier configuration for coupling the drain electrode of said second field effect transistor to the base electrode of said second bipolar transistor;

means for coupling each of the emitter electrodes of said first and said second bipolar transistors to said second terminal; and a fifth terminal connected to the emitter electrode of said second bipolar transistor for supplying response to said input signal potential.

8. An amplifier as set forth in claim 7 wherein the source electrodes of said first and said second field effect transistors are coupled to each other as said, via resistive means.

9. An amplifier as set forth in claim 7 wherein said means for coupling each of the emitter electrodes of said first and said second bipolar transistors to said second terminal includes:

current mirror amplifier means having an input terminal connected to the emitter electrode of said first bipolar transistor, having a common terminal connected to said second terminal, and having an output terminal connected to the emitter electrode of said second bipolar transistor.

10. An amplifier as set forth in claim 9 having:

a fifth bipolar transistor of said second conductivity type having a base electrode to which said second bipolar transistor emitter electrode is direct coupled, having an emitter electrode direct current conductively connected to said second terminal and having a collector electrode;

collector load means connecting said fifth bipolar transistor collector electrode to said first terminal; and a capacitor connected between said fifth bipolar transistor collector electrode and said second bipolar transistor base electrode.

11. An amplifier as set forth in claim 10 having:

further amplifier means responding to variations in the collector current of said fifth bipolar transistor for providing an output signal; and means applying at least a portion of said output signal to at least one of said third and said fourth terminals for completing a degenerative feedback loop.

* * * * *